United States Patent
Böcherer et al.

(10) Patent No.: US 11,038,525 B2
(45) Date of Patent: Jun. 15, 2021

(54) METHODS OF CONVERTING OR RECONVERTING A DATA SIGNAL AND METHOD AND SYSTEM FOR DATA TRANSMISSION AND/OR DATA RECEPTION

(71) Applicant: Technische Universität München, Munich (DE)

(72) Inventors: Georg Böcherer, Munich (DE); Patrick Schulte, Munich (DE); Fabian Steiner, Übersee (DE)

(73) Assignee: Technische Universität München, Munich (DE)

( * ) Notice: Subject to any disclaimer, the term of this patent is extended or adjusted under 35 U.S.C. 154(b) by 0 days.

(21) Appl. No.: 16/339,675

(22) PCT Filed: Sep. 29, 2017

(86) PCT No.: PCT/EP2017/074878
§ 371 (c)(1),
(2) Date: Apr. 4, 2019

(87) PCT Pub. No.: WO2018/065329
PCT Pub. Date: Apr. 12, 2018

(65) Prior Publication Data
US 2020/0052713 A1 Feb. 13, 2020

(30) Foreign Application Priority Data
Oct. 5, 2016 (EP) .................... 16192404

(51) Int. Cl.
 *H03M 7/40* (2006.01)
 *H04L 27/36* (2006.01)
 *H04L 27/38* (2006.01)
(52) U.S. Cl.
 CPC ............ *H03M 7/40* (2013.01); *H04L 27/361* (2013.01); *H04L 27/38* (2013.01)

(58) Field of Classification Search
 CPC ......... H03M 7/40; H04L 27/361; H04L 27/38
 (Continued)

(56) References Cited

U.S. PATENT DOCUMENTS

| | | | |
|---|---|---|---|
| 5,388,124 A | 2/1995 | Laroia et al. | |
| 7,778,341 B2* | 8/2010 | Tong | H03M 13/258 375/265 |

FOREIGN PATENT DOCUMENTS

WO WO 02/15443 A1 2/2002

OTHER PUBLICATIONS

Amjad, Rana Ali, "Algorithms for Simulation of Discrete, Memoryless Sources," a master's thesis presented to Technische Universität München Lehrstuhl für Nachrichtentechnik, Oct. 29, 2013, 75 pages.

(Continued)

*Primary Examiner* — Kevin M Burd
(74) *Attorney, Agent, or Firm* — DASCENZO GATES Intellectual Property Law, P.C.

(57) ABSTRACT

A method (C) for converting a data signal (U), comprising (i) providing an input symbol stream (B) representative of the data signal (U), (ii) demultiplexing (DMX) the input symbol stream (B) to consecutively decompose the input symbol stream (B) into a number m of decomposed partial symbol streams (B_1, . . . , B_m), (iii) applying on each of the decomposed partial symbol streams (B_1, . . . , B_m) an assigned distribution matching process (DM_1, . . . , DM_m), thereby generating and outputting for each decomposed partial symbol stream (B_1, . . . , B_m) a respective pre-sequence (bn_1, . . . , bn_m) or n_j symbols as an intermediate output symbol sequence, and (iv) supplying the pre-sequences (bn_1, . . . , bn_m) to at least one symbol mapping process (BM) to generate and output a signal representative for a final output symbol sequence (S) as a (Continued)

converted data signal. Each of the distribution matching processes (DM_1, . . . , DM_m) and the symbol mapping process (BM) are based on a respective assigned alphabet (ADM_1, . . . , ADM_m; ABM) of symbols, and the cardinality of each of the alphabets (ADM_1, . . . , ADM_m) of the distribution matching processes (DM_1, . . . , DM_m) is lower than the cardinality of the alphabet (ABM) of the symbol mapping process (BM).

24 Claims, 13 Drawing Sheets

(58) Field of Classification Search
USPC ........................................................ 375/261
See application file for complete search history.

(56) References Cited

OTHER PUBLICATIONS

Böcherer et al., "Bandwidth Efficient and Rate-Matched Low-Density Parity-Check Coded Modulation," *IEEE Transactions on Communications* (Dec. 2015), vol. 63, No. 12, pp. 4651-4665.

Böcherer et al., "Block-to-Block Distribution Matching," arXiv:1302.1020 (Feb. 5, 2013), 5 pages.

Eyuboglu, et al., "Advanced Modulation Techniques for V.Fast," *European Transactions on Telecommunications and Related Technologies* (1993), vol. 4, No. 3, pp. 243-256.

Sterian, et al., "Reducing the peak and average power for ODFM systems using QAM by constellation shaping" *European Transactions on Telecommunications* (Apr. 28, 2009), vol. 21, pp. 35-49.

Schulte et al., "Constant Composition Distribution Matching," *IEEE Transactions on Information Theory* (Jan. 2016), vol. 62, No. 1, pp. 430-434.

Böcherer, Georg, "Capacity-Achieving Probabilistic Shaping for Noisy and Noiseless Channels," a doctoral dissertation presented to Rheinisch-Westfälischen Technischen Hochschule Aachen, Feb. 13, 2012.

Kschischang, Frank R., "Optimal Nonuniform Signaling for Gaussian Channels," *IEEE Transactions on Information Theory* (May 1993), vol. 39, No. 3, pp. 913-929.

Blahut, Richard E., "Computation of Channel Capacity and Rate-Distortion Functions," *IEEE Transactions on Information Theory* (Jul. 1972), vol. 18, No. 4, pp. 460-473.

Buchali et al., "Rate Adaptation and Reach Increase by Probabilistically Shaped 64-QAM: An Experimental Demonstration," *Journal of Lightwave Technology* (Apr. 1, 2016), vol. 34, No. 7, pp. 1599-1609.

* cited by examiner

|       |        |       | $P_{B_i}(0)$ | $P_{B_i}(1)$ |
|-------|--------|-------|--------------|--------------|
| $DM_1$ | output | $B_1$ | 0.5          | 0.5          |
| $DM_2$ | output | $B_2$ | 0.18         | 0.82         |
| $DM_3$ | output | $B_3$ | 0.53         | 0.47         |

| symbol | -7 | -5 | -3 | -1 | 1 | 3 | 5 | 7 |
|---|---|---|---|---|---|---|---|---|
| probability | 2/30 | 3/30 | 4/30 | 6/30 | 6/30 | 4/30 | 3/30 | 2/30 |

METHODS OF CONVERTING OR RECONVERTING A DATA SIGNAL AND METHOD AND SYSTEM FOR DATA TRANSMISSION AND/OR DATA RECEPTION

The present invention refers to methods for converting or reconverting a data signal and to a method and a system for data transmission and/or data reception.

In the field of converting, transmitting and/or receiving data signals over certain kinds of channels in order to communicate symbol sequences a certain degree of power consumption is accompanied with the underlying processes.

It is an object underlying the present invention to present methods of converting or reconverting data signals and methods and systems for data transmission and/or data reception with an increased reliability of the underlying processes under reduced power consumption or at least improved power efficiency.

The object underlying the present invention is achieved by a method for converting a data signal or alternatively by a data transmission system and by a data reception system.

According to a first aspect of the present invention a method for converting a data signal is provided which comprises processes of providing an input symbol stream being representative for the data signal to be converted, demultiplexing the input symbol stream in order to consecutively decompose the input symbol stream into a number m of decomposed partial symbol streams with m being a natural number, applying on each of the decomposed partial symbol streams an assigned distribution matching process thereby generating and outputting for each decomposed partial symbol stream a respective pre-sequence of $n\_j$ symbols as an intermediate output symbol sequence, with $n\_j$ being a natural number for all $j=1$ to $m$, and supplying the pre-sequences output by the distribution matching processes to at least one symbol mapping process in order to generate and output a signal representative for a final output symbol sequence as a converted data signal.

According to the present invention each of the distribution matching processes and the symbol mapping process are based on a respective assigned alphabet of symbols and the cardinality of each of the alphabets of the distribution matching processes is lower than the cardinality of the alphabet of the symbol mapping process.

It is therefore a key aspect of the present invention to choose the alphabets of the underlying distribution matching processes in such a manner to have a lower cardinality, i.e. a lower number of different elements in the set of members describing the respective alphabet, then the cardinality of the symbol mapping process. With such a selection it is possible to process the data to be converted and in particular to manage its transmission which a higher degree of efficiency.

The present invention may be applied in the context of more concrete forms of symbols.

Therefore, in some practical applications the inventive method may focus on symbols in the form of binary digits, i.e. bits. Thus and according to the present invention and in certain embodiments thereof the terms input symbol stream, partial symbol stream, distribution matching process, pre-sequence of symbols, intermediate output symbol sequence, symbol mapping process, final output symbol sequence and the like may be focused on symbols in the form of bits thereby replacing these mentioned regular terms by respective specialized technical terms of input bit stream, partial bit stream, bit distribution matching process, pre-sequence of bits, intermediate output bit sequence, bit mapping process, final output bit sequence and the like, respectively.

Each stage and even intermediate stages of the process according to the present invention may refer to bits and bit combinations as symbols.

The following additional remarks further elucidate the technical background and key aspects of the present invention:

A distribution matcher—also denoted by DM—in the sense of the present invention may be referred to as a general means or as a device which is configured in order to transform uniformly distributed bits into a sequence of symbols with a given empirical distribution.

The concept of probabilistic shaping is more broad and is meant to address the system perspective where the DM is one component only, for instance in the sense of a combination of a DM with forward error correction process—also denoted by FEC—in a communication system to approach Shannon capacity.

This means in particular that the terms and concepts are not exchangeable. Instead, a distribution matcher can be implemented by means of various methods and in particular a variety of algorithms.

For instance, one approach is the constant composition distribution matcher also denoted by CCDM and explained in the publication [1] listed below. Additionally or alternatively the approach described in the publication [2] listed below may be involved.

The natural based binary code—also denoted by NBBC—and its construction are described for arbitrary constellation sizes in the section "Generating Symbol Distributions" below in the following sections. Natural binary codes are well known in the art and are for instance described in the publication [3], e.g. in chapter 3.5 thereof.

The concept of look-up tables—also denoted by LUT—describes a way how distribution matchers may be implemented theoretically. However, as pointed out below, this may become infeasible at a certain point because it has too many entries. The objective to save memory in a practical system, for instance within a given hardware concept, is demanding e.g. as silicon dies are a scarce resource. Instead of saving the required look-up table, practical implementations therefore need to calculate the mapping of input bits to output symbol sequences on the fly.

For better understanding the background of the present invention it is also necessary to understand that so called Huffman codes provide a fixed-to-variable-length coding scheme and hence are not suited for desired block-to-block operation underlying the present invention.

There has been further investigations on distribution matchers in the publication [4] listed below and before, although they may have been named differently or may have been used in a different context back then. An example is presented in publication [2] listed below. Besides, the underlying principle of CCDM, arithmetic coding is used in various multimedia codecs.

Regarding the complexity of binary DMs it has to be noticed that a simple example why binary DMs are less complex can be constructed in the way how arithmetic coding works, the foundation of constant composition distribution matching. The process or algorithm needs to keep track of how often each symbol has been outputted in the past. Obviously, if the number of symbols is smaller, this becomes easier. For binary DMs, this bookkeeping is particularly easy, as only bit shifts are involved.

For further illustration, the very last example mentioned in the section "further example" sheds some further light on this.

In order to further increase the efficiency of the underlying processes each respective one of the distribution matching processes can be configured to be invertible, thereby ensuring a 1-to-1 mapping of symbol sequences.

According to a further preferred embodiment of the method for converting a data signal, each respective one of the distribution matching processes may be configured to use a respective number $k\_j$ of consecutive symbols provided by the demultiplexing process, with $k\_j$ for each $j=1, \ldots, m$ being a natural number.

Under such circumstances, for a respective distribution matching process the respective number $k\_j$ of consecutive symbols is one of fixed or variable.

In particular a variable number of $k\_j$ consecutive symbols connected with each of the respective distribution matching processes increases the flexibility and thereby the efficiency of the inventive method for converting a data signal.

According to a further preferred aspect of the present invention, additionally or alternatively the symbol mapping process may be configured to be invertible, too.

According to a further advantageous embodiment of the present invention, the numbers of consecutive symbols provided with the respective pre-sequences and by the respective underlying distribution matching processes may be one of different or identical.

In other words, each of the distribution matching processes may be configured such that for each pair of distribution matching processes the relation $$n\_j1 = n\_j2 \quad (1)$$

may be fulfilled, for each $j1, j2=1, \ldots, m$ being natural numbers and with $n\_j1, n\_j2$ as natural numbers describing the number of consecutive symbols provided with the respective pre-sequence and by the respective underlying distribution matching processes.

Additionally or alternatively, the underlying process of providing the input symbol stream may comprise at least one of recalling the input symbol stream from a storage medium or from a symbol generation process and receiving, demodulating and/or decoding a signal being representative for or conveying the input symbol stream.

A particular high degree of power efficiency may be achieved if each of the distribution matching processes and/or said symbol mapping process is/are at least one of based on and chosen according to a predefined distribution and in particular on a Gaussian distribution.

However and depending on the particular application, other distributions may be more suitable.

The construction of the respectively underlying distribution shall be realized by the respective distribution matching process. In other words, each of the distribution matching processes may be configured in order to arrange the consecutive symbols provided by the demultiplexing process within each respective one of the pre-sequences of $n\_j$ symbols, such that for the final output symbol sequence the empirical distribution coincides with or approaches the respective underlying distribution.

For instance, this may be achieved if each of the distribution matching processes and/or said symbol mapping process is/are configured in order to achieve an approach of the empirical distribution of the final output symbol sequence to the respective underlying distribution by accordingly indexing the respective output sequences out of a respective entire set of candidates.

According to a further preferred embodiment of the inventive method for converting a data signal, the symbol mapping process may have m input channels.

Additionally or alternatively, m input channels may be distributed over a plurality of symbol mapping sub-processes constituting the symbol mapping process in its entirety.

In a concrete embodiment, the symbol mapping process may be based on a modulation process and in particular on a digital or analog quadrature amplitude modulation process.

Further, the inventive method for converting a data signal may be simplified if the input symbol stream, at least one of the partial symbol streams, at least one of the respective pre-sequences of intermediate output symbol sequences and/or the final output symbol sequence are at least partially formed by binary bits.

According to another aspect of the present invention a method for reconverting a data signal is provided, in particular in view of an already converted data signal.

This method comprises processes of providing an input symbol stream being representative for the—in particular converted—data signal to be reconverted, supplying said input symbol stream to at least one inverse symbol mapping process with m output channels and m being a natural number in order to generate and output a number of m intermediate output symbol sequences of $n\_j$ symbols with $n\_j$ being a natural number for all $j=1$ to m, applying to each of the intermediate output symbol sequences an assigned inverse distribution matching process thereby generating and outputting for each of the intermediate output symbol sequences a respective partial symbol stream of $k\_j$ symbols, with $k\_j$ being a natural number for all $j=1$ to m, and multiplexing the partial symbol streams in order to consecutively compose and output a final output symbol stream being the or being representative for the reconverted data signal.

Under such circumstances, each of the inverse distribution matching processes and the inverse symbol mapping process are based on a respective assigned alphabet of symbols and the cardinality of each of the alphabets of the inverse distribution matching processes is lower than the cardinality of the alphabet of the inverse symbol mapping process.

Each respective one of the inverse distribution matching processes may be configured to be invertible.

In addition or alternatively, each respective one of the inverse distribution matching processes may be configured to output a respective number $k\_j$ of consecutive symbols to be provided to the multiplexing process, with $k\_j$ for each $j=1, \ldots, m$ being a natural number and for a respective inverse distribution matching process the respective number $k\_j$ of consecutive symbols may be one of fixed or variable. Variability of the numbers $k\_j$ yields inherently variability of the entire process.

The inverse symbol mapping process may be configured to be invertible, too.

For simplifying the method for reconverting a data signal, according to a further preferred embodiment thereof each of the inverse distribution matching processes may be configured such that for each pair of inverse distribution matching processes the relation $$n\_j1 = n\_j2 \quad (1)$$

may be fulfilled, for each j1, j2=1, . . . , m being natural numbers and n_j1, n_j2 describing the number of consecutive symbols to be provided with the respective sequences to the respective underlying inverse distribution matching processes.

Additionally or alternatively, the process of providing the input symbol stream may comprise at least one of recalling the input symbol stream from a storage medium or from a symbol generation process, and receiving, demodulating and/or decoding a signal being representative for or conveying the input symbol stream.

Further, each of the inverse distribution matching processes and/or said inverse symbol mapping process may be at least one of based on and chosen according to a predefined distribution and in particular on a Gaussian distribution. Again, other than Gaussian distributions may be involved.

Each of the inverse distribution matching processes DM_j with j=1, . . . , m may be configured such that the underlying distribution matching processes DM_j with j=1, . . . , m is capable of arranging the consecutive symbols provided by a demultiplexing process DMX within a respective one of the pre-sequences bn_1, . . . , bn_m of n_j symbols, such that for a final output symbol sequence S the empirical distribution coincides with or approaches the respective underlying distribution.

Additionally or alternatively
each of the inverse distribution matching processes DM_j$^{-1}$ with j=1, . . . , m and/or
said inverse symbol mapping process BM$^{-1}$
may be configured such that the underlying distribution matching processes DM_j with j=1, . . . , m and/or symbol mapping process BM are capable of approaching the empirical distribution of a final output symbol sequence S to the respective underlying distribution by accordingly indexing respective output sequences out of a respective entire set of candidates.

According to another aspect of the present invention a method for data transmission and/or data reception is provided. The inventive method comprises at least one of a data transmission section and a data reception section. The data transmission section and/or the data reception section may involve at least one of the inventive methods for converting a data signal and for reconverting a data signal as described above.

In a preferred embodiment of the inventive method for data transmission and/or data reception, involved distribution matching processes and inverse distribution matching processes may be inverse to each other and/or may have respectively coinciding alphabets.

Additionally or alternatively, involved symbol mapping processes and inverse symbol mapping processes may be inverse to each other and/or may have respectively coinciding alphabets.

A data transmission and/or data reception system is suggested by the present invention, too. The inventive system comprises a processing unit configured to perform any of the methods according to the present invention and comprises respective means for carrying out such methods.

Furtheron, the inventive methods as described above may be realized by a code acceptable and executable by a computer or a digital signal processing means.

Also within the scope of the present invention, a computer program product is provided, comprising a computer code adapted to let a computer and/or a digital signal processing means execute any of the methods according to the present invention when the code is run on the computer and/or the digital signal processing means, respectively.

These and further aspects, details, advantages and features of the present invention will be described based on embodiments of the invention and by taking reference to the accompanying figures.

FIGS. 1 to 5 show block diagrams elucidating general aspects of the method for converting a data signal according to the present invention. In particular:

FIG. 1 conveys a block diagram for elucidating a demultiplexing process DMX.

FIG. 6 is a schematic block diagram describing the application of an inverse symbol mapping process to an input symbol sequence.

FIG. 7 is a schematic block diagram elucidating the application of inverse distribution matching processes to sequences of symbols.

FIG. 8 is a schematic block diagram elucidating the application of the multiplexing process to symbol sequences.

Figures 9, 10:
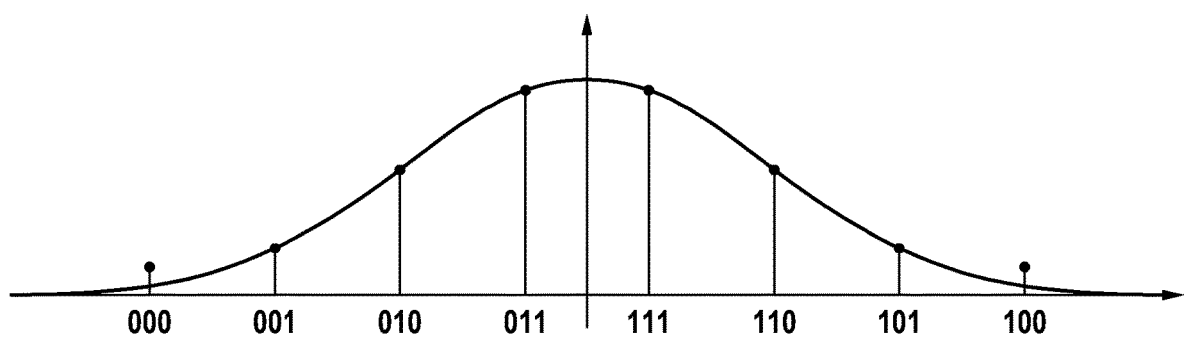

FIGS. 9 to 13 exemplify a concrete embodiment of the method for converting a data signal according to the present invention using a plurality of three distribution matches. In particular:

FIG. 9 elucidates by means of a table the distributions of binary output sequences.

FIG. 10 gives a graphical representation of the distributions of binary output sequences.

Figure 11:
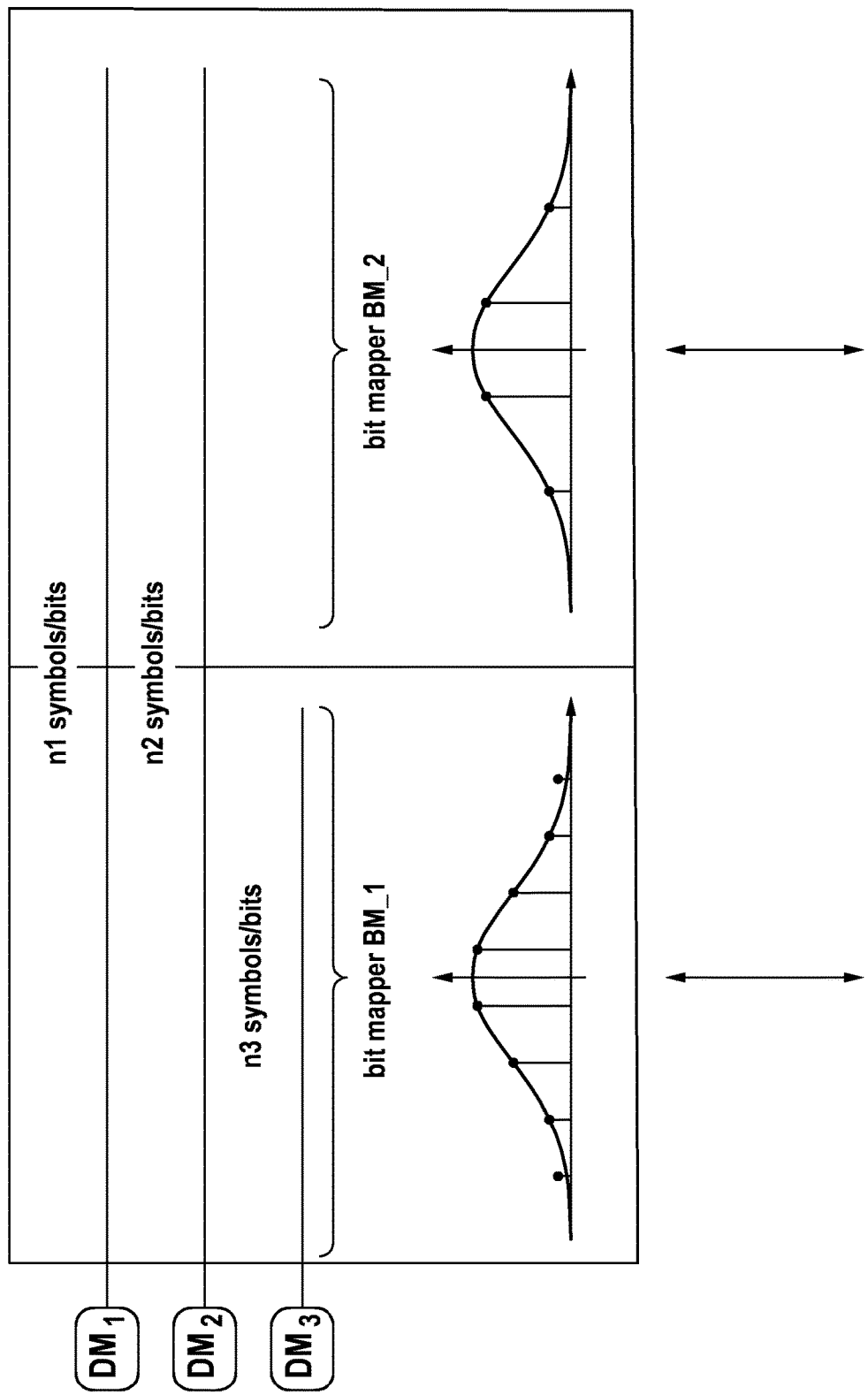

FIG. 11 is a graphical representation of distributions based originating from two bit mappers.

Figure 12:
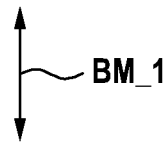

FIG. 12 by means of a table elucidates the action of a first bit mapper from FIG. 11.

Figure 13:
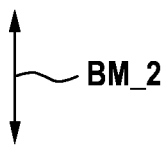

FIG. 13 by means of a table elucidates the action of a second bit mapper from FIG. 11.

Figures 14, 15:
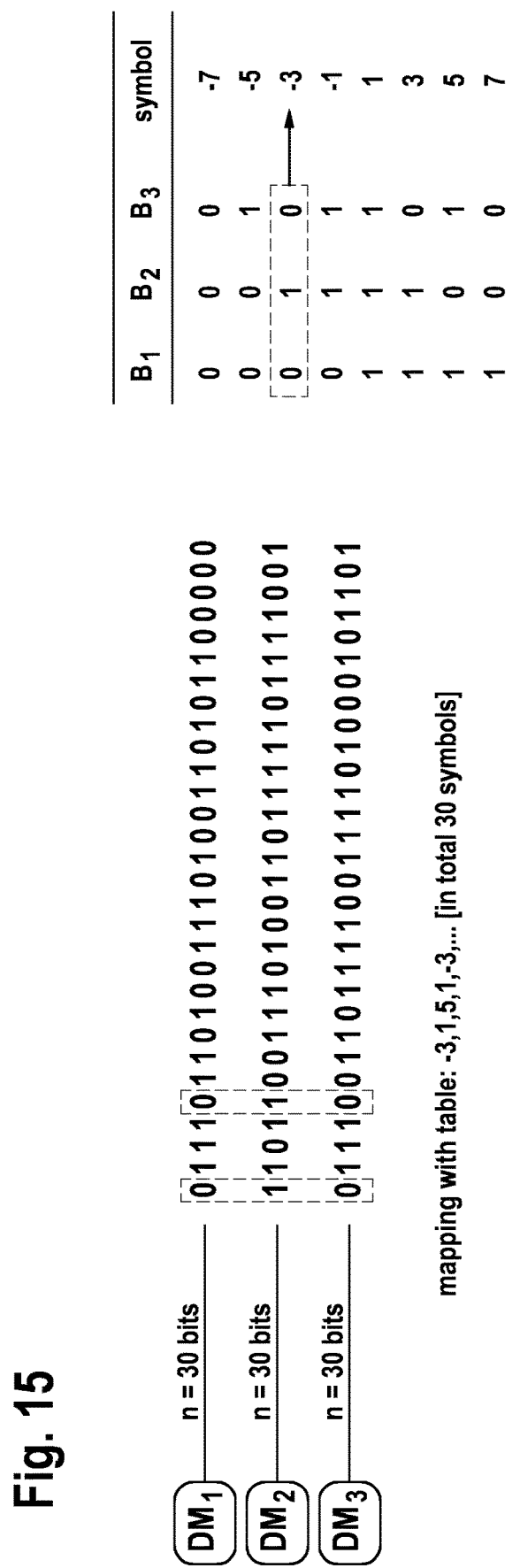

FIGS. 14 and 15 demonstrate an alternative concrete embodiment of the method for converting a data signal according to the present invention using a plurality of three distribution matches. In particular:

FIG. 14 by means of a table elucidates the distribution of certain symbols.

FIG. 15 by means of a table elucidates a desired distribution for an example of constellation points.

Figure 16:
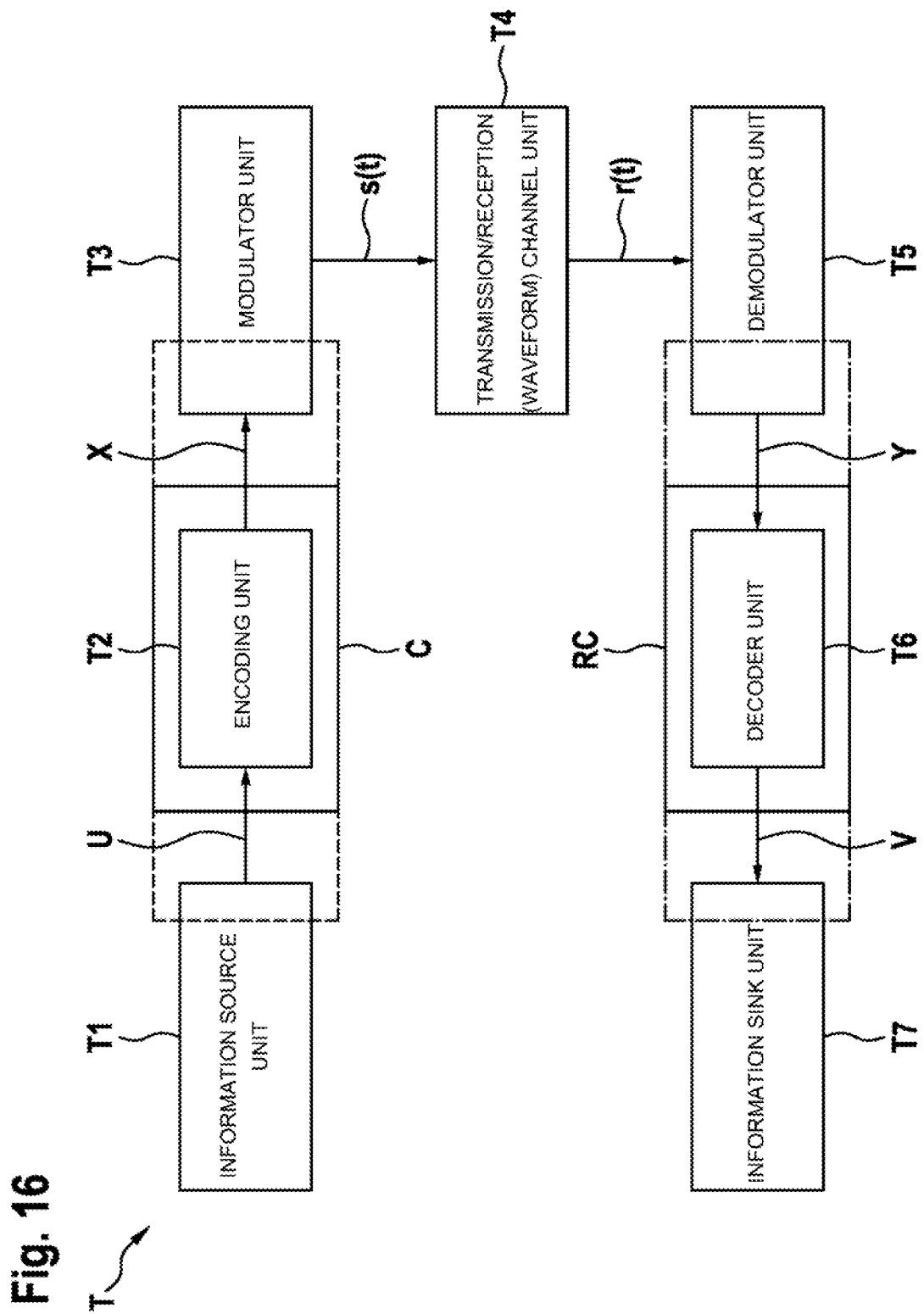

FIG. 16 is a block diagram for elucidating embodiments of a data transmission and/or data reception system according to the present invention and the embedding of the methods for converting/reconverting a data signal embedded therein.

In the following embodiments and the technical background of the present invention are presented in detail by taking reference to accompanying FIGS. 1 to 16. Identical or equivalent elements and elements which act identically or equivalently are denoted with the same reference signs. Not in each case of their occurrence a detailed description of the elements and components is repeated.

The depicted and described features and further properties of the invention's embodiments can arbitrarily be isolated and recombined without leaving the gist of the present invention.

Before going into detail with respect to aspects of the methods for converting/reconverting a data signal and the methods for data transmission/reception reference is taken to FIG. 16 and its general view on systems and methods for data conversion/reconversion and/or data transmission/reception.

Therefore, FIG. 16 is a block diagram for elucidating embodiments of a data transmission and/or data reception system according to the present invention and the embedding of the methods for converting/reconverting a data signal embedded therein.

The scheme according to FIG. 16 generally follows the concept of coding and modulation in digital communication proposed in 1974 by Massey. The scheme of FIG. 16 discloses a system T—being it a hardware structure, a configuration of a method or of processing units or a combination thereof—comprising (i) an information source unit T1 configured to provide a signal U to be converted and transmitted, an (ii) encoding unit T2 configured to receive and encode the signal U and to output an encoded signal X, (iii) a modulator unit T3 configured to receive and modulate the encoded signal X and to output a modulated signal s(t) for transmission over (iv) a transmission/reception waveform channel unit T4, (v) a demodulator unit T5 configured to receive the modulated signal s(t) in a form r(t) possibly distorted by the transmission channel unit T4 and to demodulate said signal in order to output a demodulated signal Y, (vi) a decoder unit T6 configured to receive and decode the demodulated signal Y and to output the decoded signal V, and (vii) an information sink unit T7 configured to receive the decoded signal V.

According to the present invention, the information source T1 and the information sink T7 may be any kind of information or signal sink or source, respectively. Any kind of storage medium may be used. Alternatively, any arbitrary other transmitting/receiving channel may be involved.

As already mentioned above, according to the present invention a method C for converting a data signal U and alternatively or additionally a method RC for reconverting a data signal Y are provided. These methods C and RC according to the present invention may embrace or be a part of the information encoding unit T2 and decoding unit T6, respectively. Additionally or alternatively, parts of the information source unit T1 and/or of the modulator unit T3 on the one hand and of the demodulator unit T5 and/or of the information sink unit T7 on the other hand may be realized, too.

FIGS. 1 to 5 elucidate by means of block diagrams general aspects of the method C for converting a data signal U according to the present invention.

The data signal U obtained from an information source unit T1 in the case shown in FIGS. 1 to 5 is represented by or identical to an input symbol stream B which is not necessarily but may be a stream of binary digits or bits. The input symbol stream B may have a finite length or may be represented as a continuous flow of symbols.

Figure 1:
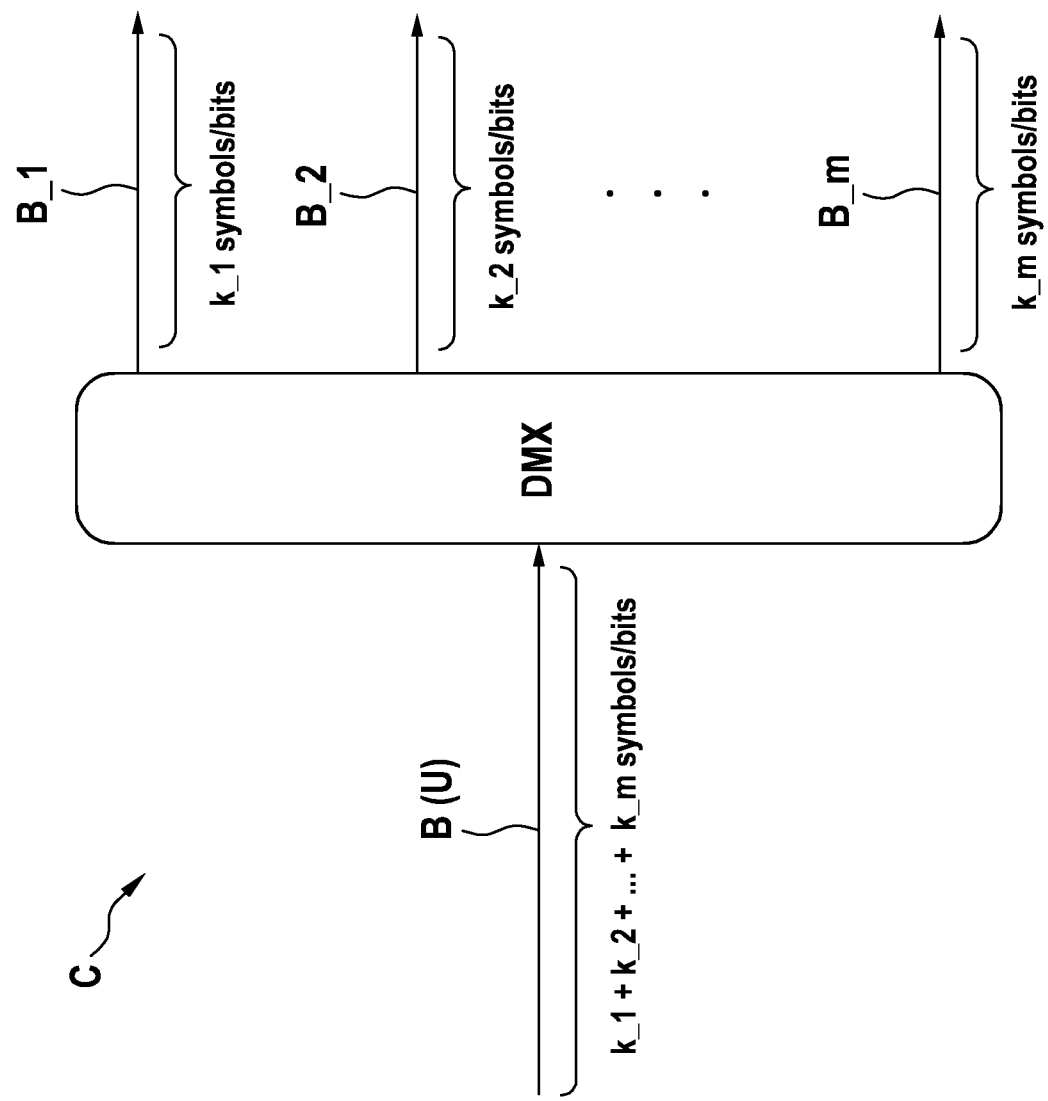

In this example, a finite number k_1+ . . . +k_m of symbols or bits is supplied to a demultiplexing process or unit DMX. By the action of the demultiplexing process or unit DMX from the incoming input symbol stream B a number of m sets of k_1, . . . , k_m symbols are selected as partial symbol streams B_1, . . . , B_m. This process is schematically shown in FIG. 1.

Figure 2:
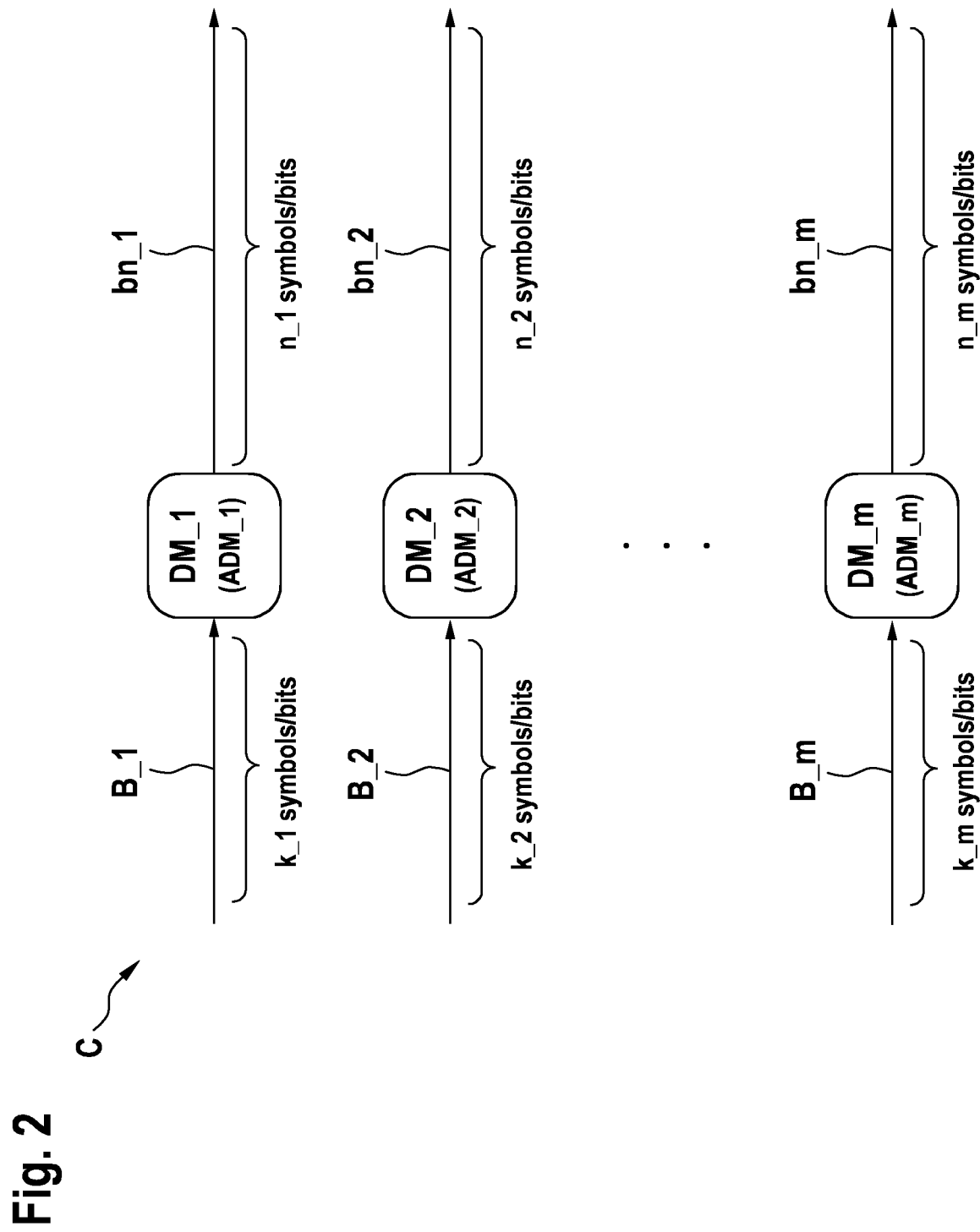
FIG. 2 is a block diagram elucidating the application of distribution matchers to partial symbol streams.

According to the process shown in FIG. 2, the partial symbol streams B_1, . . . , B_m are supplied to a respective number of m distribution matchers DM_1 to DM_m each having an assigned alphabet ADM_1 to ADM_m of symbols. Each of the m distribution matchers DM_1 to DM_m is configured in order to derive from the input partial symbol streams B_1, . . . , B_m and based on the respective assigned alphabet ADM_1 to ADM_m of symbols a respective pre-sequence of symbols bn_1 to bn_m with a certain length n_1 to n_m.

According to the present invention the lengths n_1 to n_m of the pre-sequences of symbols bn_1 to bn_m based on the assigned alphabets ADM_1 to ADM_m of symbols and output by the respective distribution matchers DM_1 to DM_m may be different. However, they also may be identical when compared to each other.

In addition or alternatively, the lengths k_1, . . . , k_m of the partial symbol streams B_1, . . . , B_m input to the respective distribution matchers DM_1 to DM_m may be fixed or may be variable within the underlying process.

Figure 3:
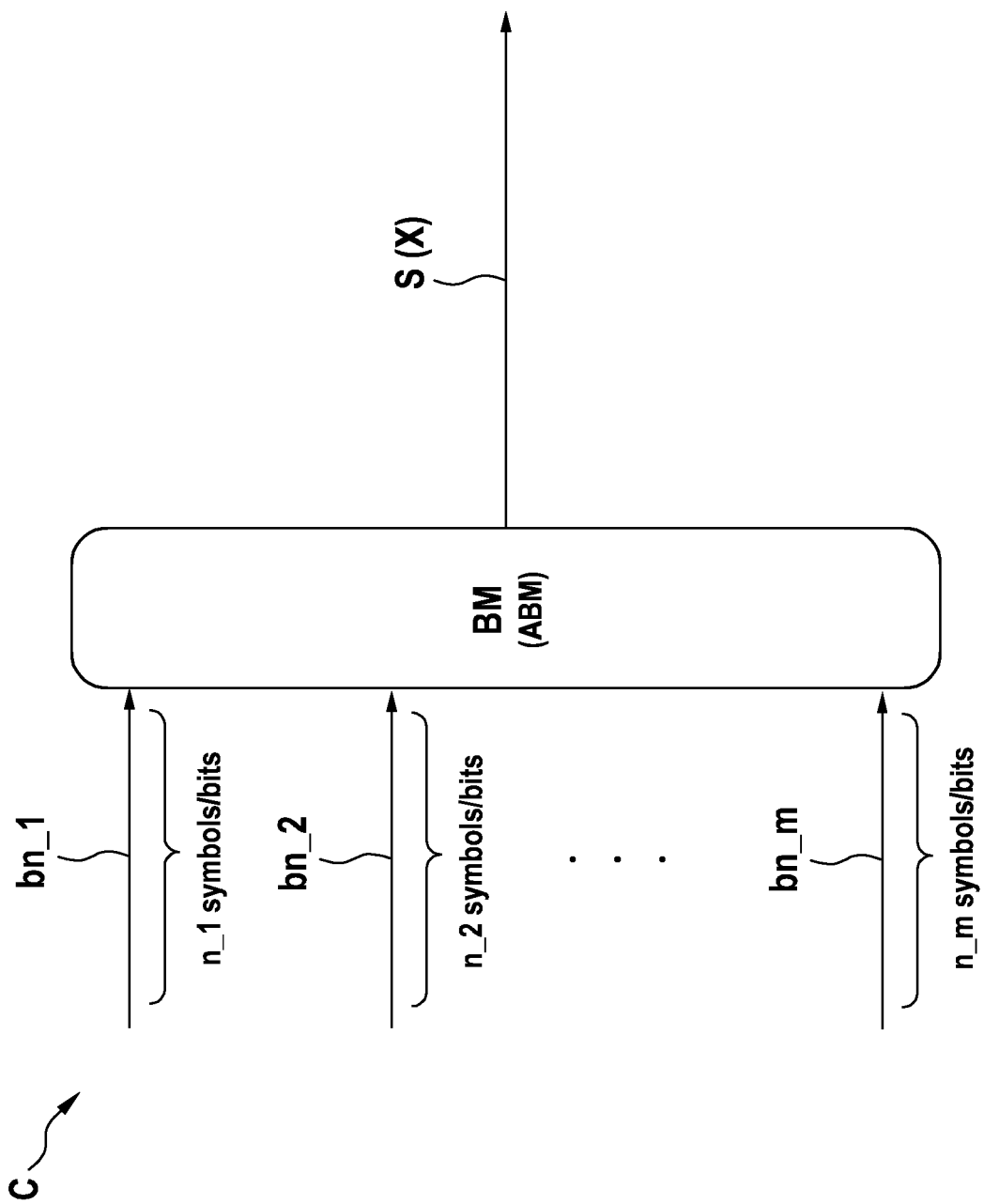
FIG. 3 is a block diagram describing the application of symbol mapping processes to pre-sequences of symbols.

The pre-sequences bn_1 to bn_m of symbols generated by the respective distribution matchers DM_1 to DM_m are supplied to a symbol mapping process or unit BM—which in the case that the symbols are binary bits may also be called a bit mapper—having an assigned bit mapper alphabet ABM as shown in FIG. 3.

It is a key aspect of the present invention that the cardinality—i.e. the number of elements of the underlying set of elements—each of the alphabets ADM_1 to ADM_m of the underlying distribution matchers DM_1 to DM_m is smaller than the cardinality of the alphabet ABM of the underlying symbol mapping process or unit BM.

According to the action of the symbol mapping process or unit BM an output symbol sequence S is generated based on the underlying bit mapper alphabet ABM and output for further transmission, processing or the like as shown in FIG. 3.

Figure 4:
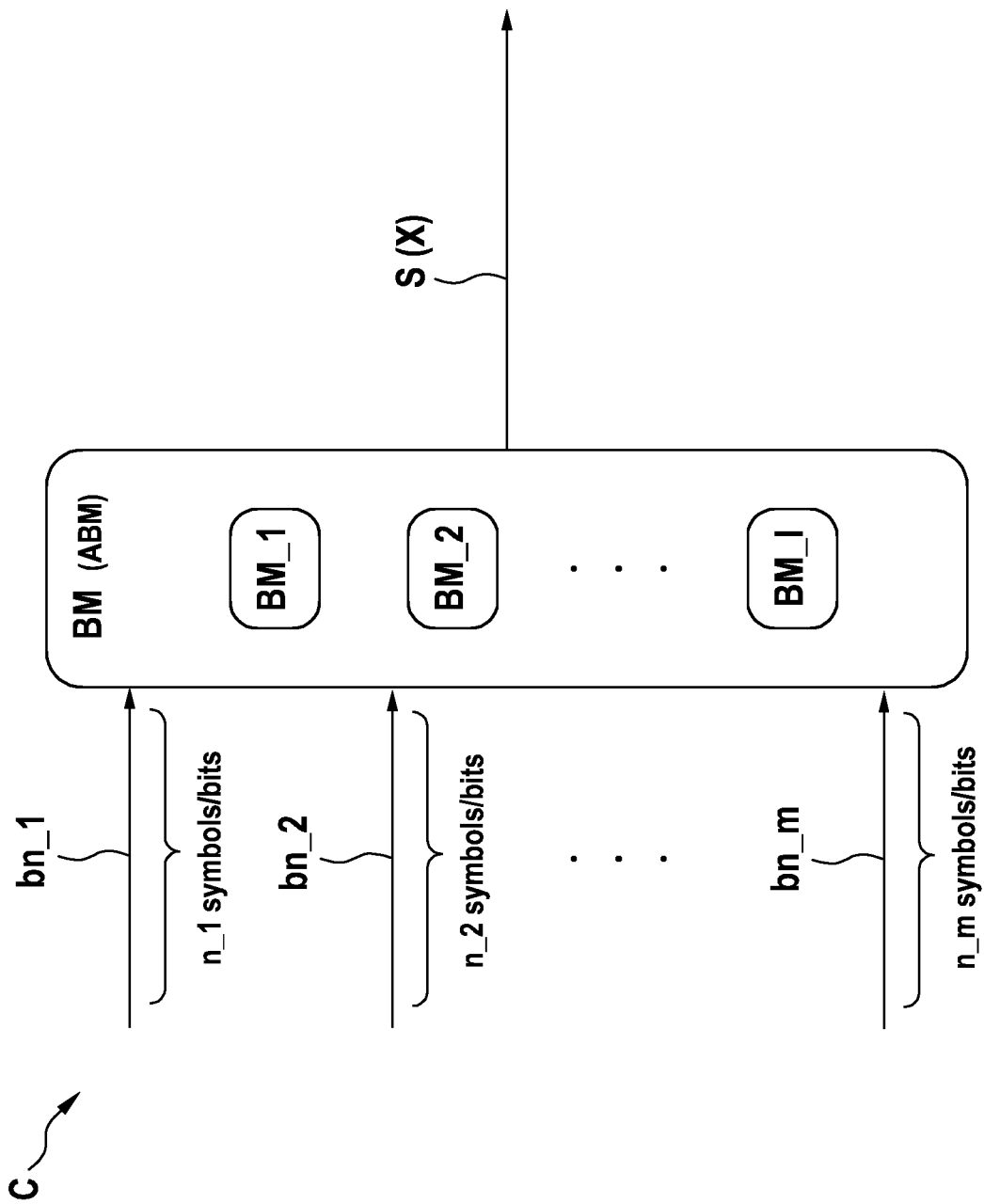
FIG. 4 is a block diagram elucidating an alternative view on the process of shown in FIG. 3.

FIG. 4 demonstrates an alternative view on the process shown in FIG. 3, wherein the bitmapping process or unit BM is composed by a plurality of bit mapping sub-processes or sub-units BM_1 to BM_l having access to respective subsets of the input pre-sequences bn_1 to bn_m in a well-defined manner.

Figure 5:
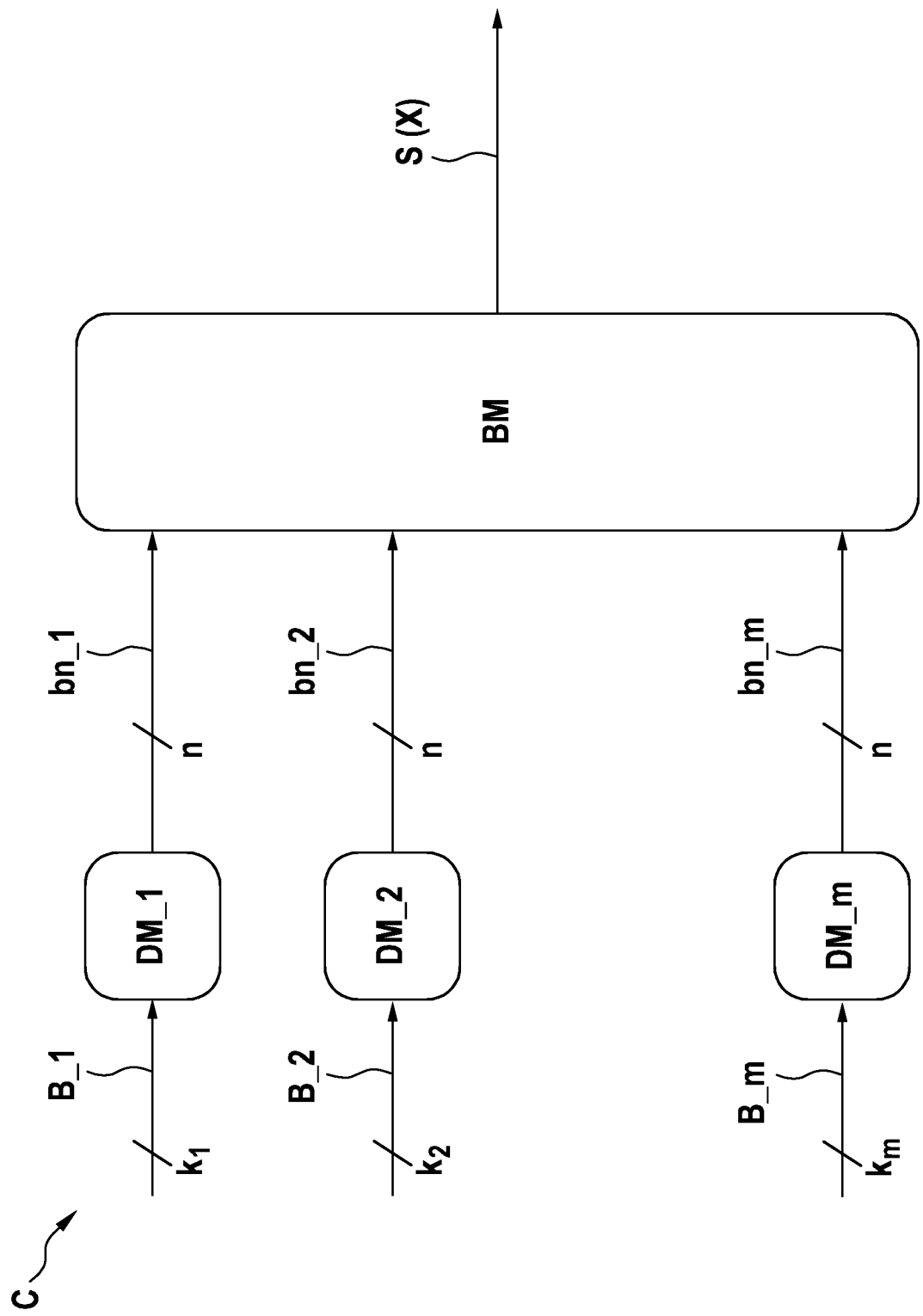
FIG. 5 is a block diagram for giving an overview and the combined processes shown in FIGS. 1 to 3.

FIG. 5 gives an overview by combining the processes of FIGS. 1 to 3.

Figure 6:
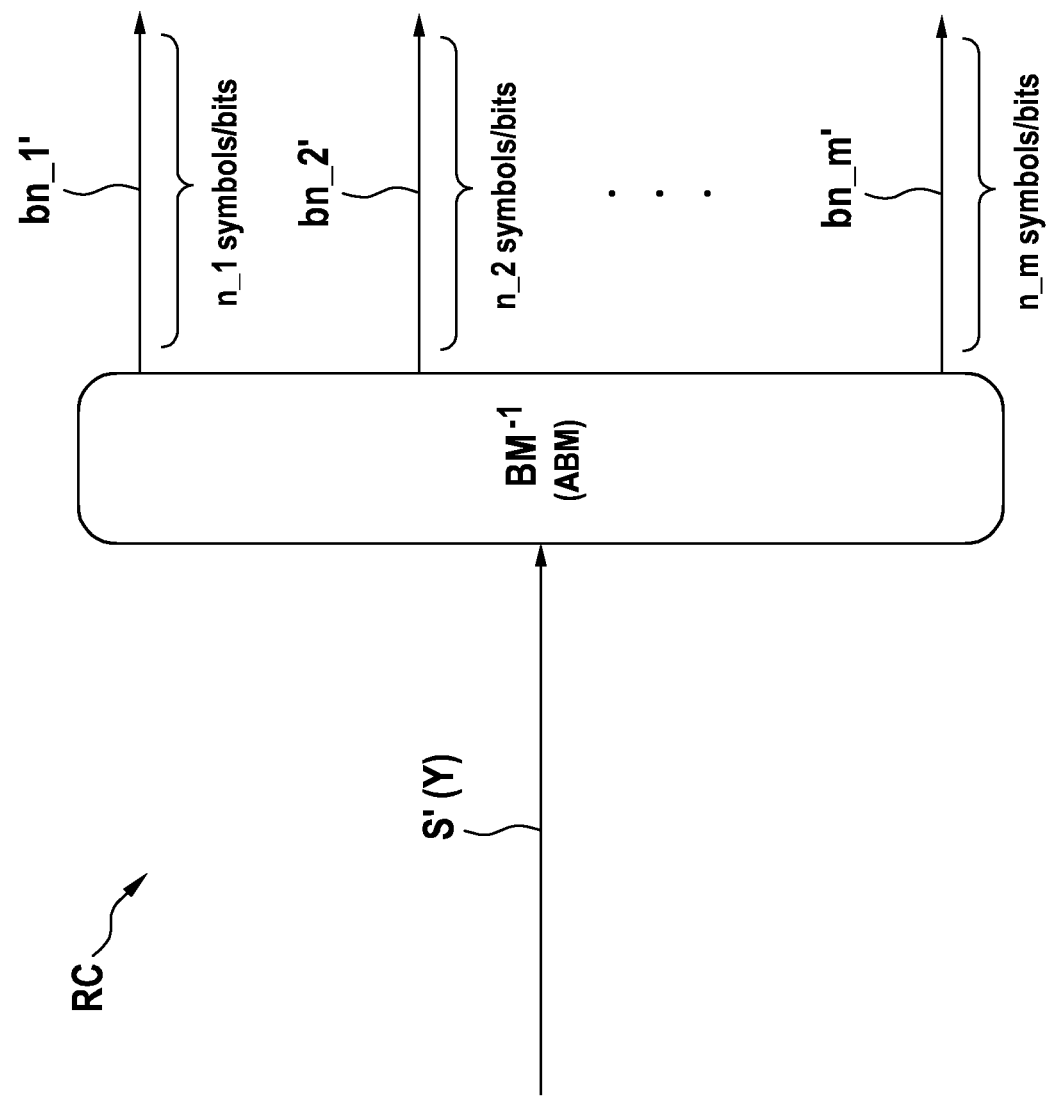
FIGS. 6 to 8 show block diagrams elucidating general aspects of the method for reconverting a data signal according to the present invention. In particular.
Figure 7:
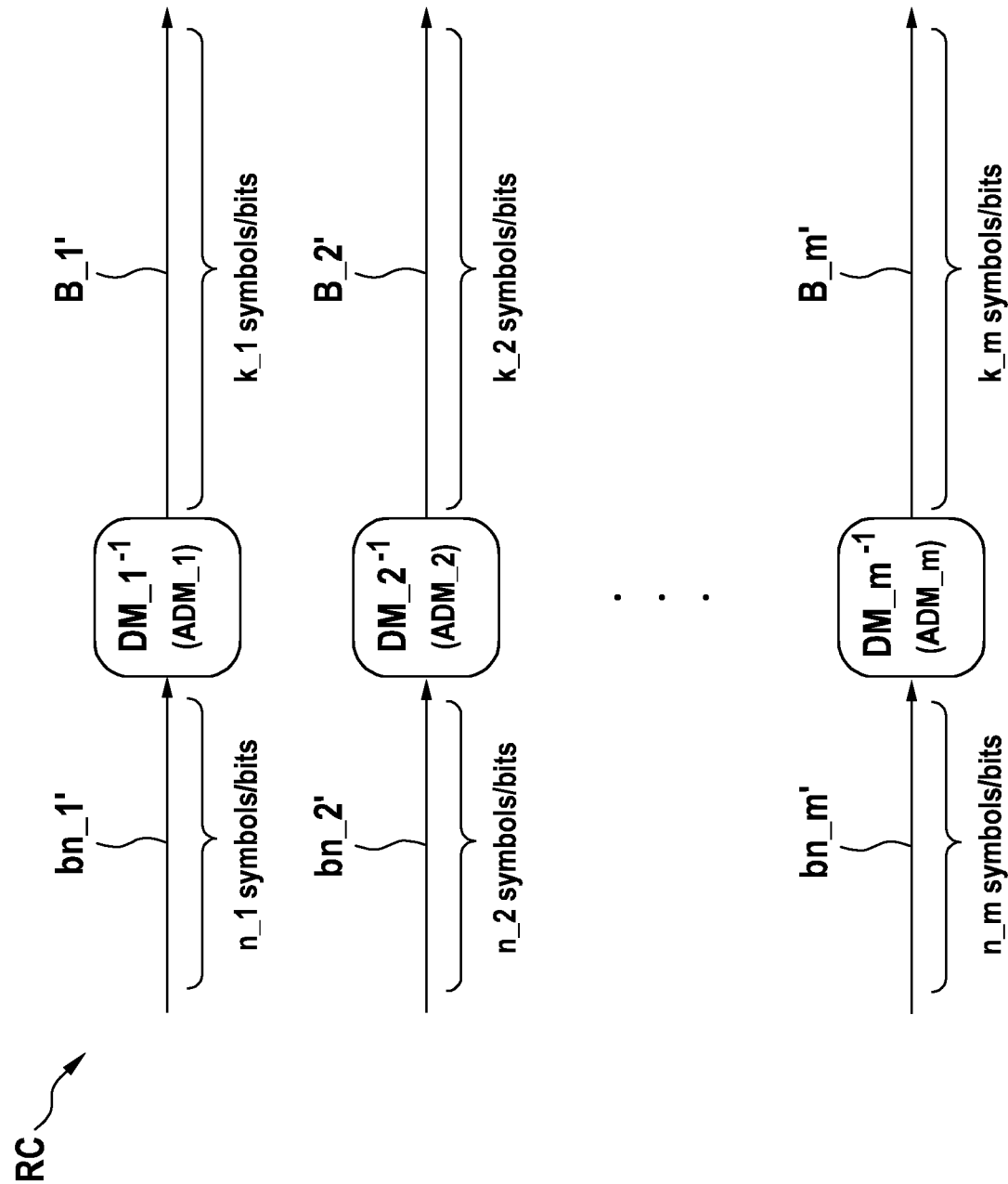
Figure 8:
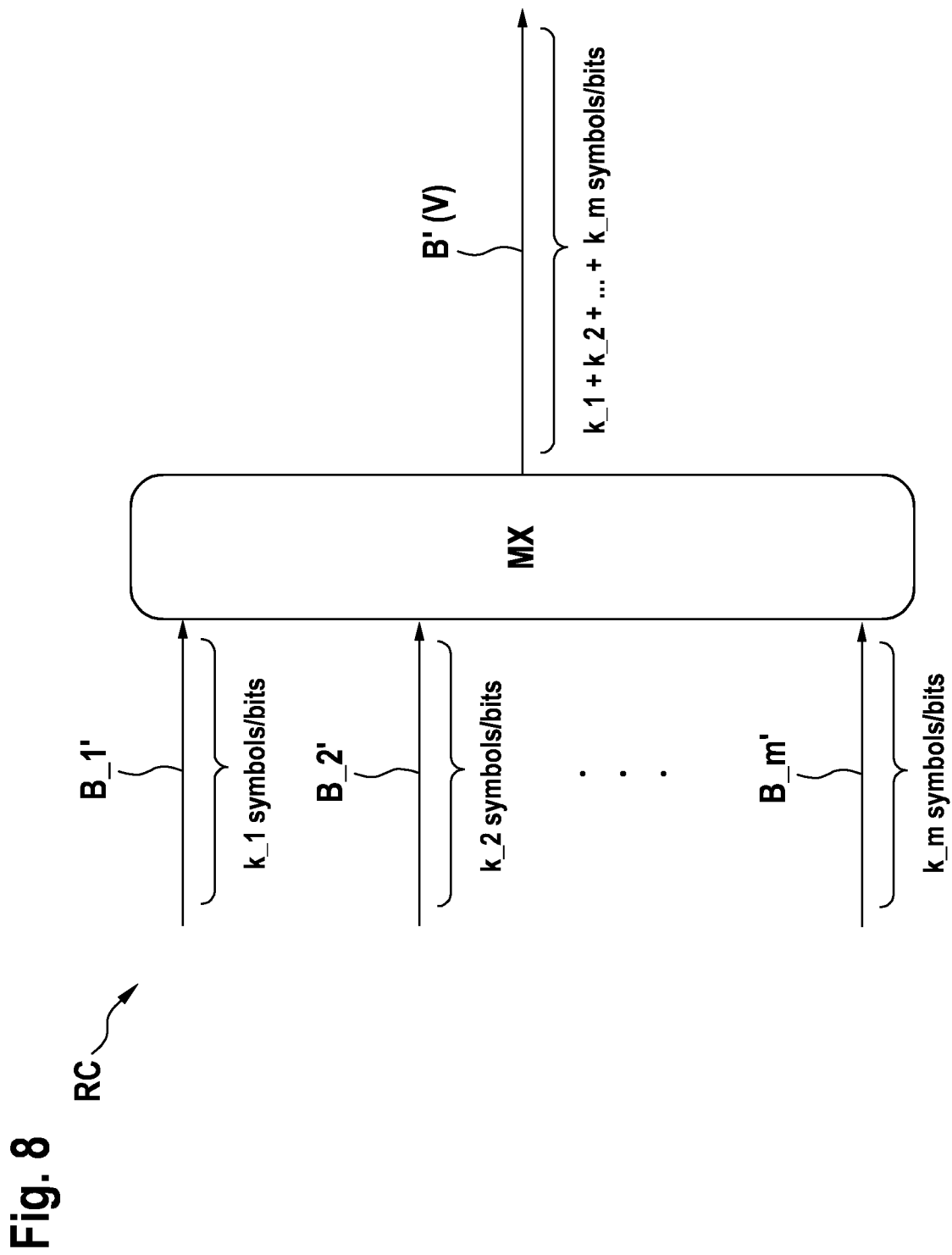

FIGS. 6 to 8 elucidate by means of block diagrams general aspects of the method RC for reconverting a data signal Y according to the present invention.

According to the present invention the method RC for reconverting a data signal Y shown in FIGS. 6 to 8 comprises more or less the inverse or opposites processing steps and results as described in connection with the processing scheme of FIGS. 1 to 5.

Here, the input symbol sequence is denoted by S' and may be identical to or representative for a demodulated signal Y received over a transmission/reception channel unit T4 shown in FIG. 16.

As shown in FIG. 6 the input symbol sequence S'—again referred to either as a finite sequence of symbols or as a continuously incoming sequence of symbols—is supplied to an inverse symbol mapping process or unit $BM^{-1}$ which is based on the respective alphabet ABM of symbols and configured to output a number of m sequences bn_1' to bn_m' of symbols of alphabets ADM_1 to ADM_m of a number of m assigned inverse distribution matching processes or units $DM1^{-1}$ to $DM\_m^{-1}$ to which the sequences bn_1' to bn_m' of symbols are respectively supplied to as can be seen in connection with FIG. 7.

According to the action of the respective inverse distribution matching processes or units $DM1^{-1}$ to $DM\_m^{-1}$ the input symbol sequences bn_1' to bn_m' out of the alphabets ADM_1 to ADM_m and having lengths n_1 to n_m (being identical or not depending on the application) are reconverted into symbol sequences B_1' to B_m' of the original set of symbols, for instance formed by binary bits.

According to FIG. 8, the symbol sequences B_1' to B_m' of the original set of symbols are supplied to a multiplexing process or unit MX in order to generate and output an output symbol stream B' which may be identical with or representative for a signal V to be supplied to an information sink unit T7 as shown in the embodiment of FIG. 16.

FIGS. 9 to 16 exemplify concrete embodiments of the method C for converting a data signal U according to the present invention in particular by using a plurality of three distribution matches. The aspects thereof are described in detail in the sections below.

In the following, these and additional aspects, features and/or properties of the present invention will be further elucidated:

The presented invention relates generally to communication methods and systems and more particularly to techniques for generating sequences of symbols—e.g. from which constituting signals are to be transmitted—with desired distributions.

In order to achieve a power efficient communication—for instance over noisy channels—symbols to be transmitted within a signal should follow a certain distribution. In order to achieve this, data bits or more general data symbols need to be mapped to a symbol sequence with a desired distribution. The mapping should be invertible, so that the original data symbols or bits can be recovered from the symbol sequence, for instance after the transmission and reception at a reception side.

Devices configured to realize such a mapping of original symbols or bits to a desired distribution of symbols or bits are called distribution matchers.

For parallel channels with different channel qualities, for example in DSL systems, each channel may need to have a sequence with a different alphabet as a fundamental set of symbols from which the members of the sequence of symbols or bits are selected.

The present invention originates from a method or algorithm which is configured to map the number of k uniformly distributed data symbols or bits to n symbols or bits with a desired distribution. This method or algorithm has two issues.

(1) Encoding and decoding become complex for large output alphabets.

(2) The output length n must be large enough to ensure that the rate k/n of the method or algorithm is close to an optimal value.

For example, in DSL—i.e. digital subscriber line communication—comparable large alphabet sizes, for instance of 256 signal points and more per real dimension, are used. Because of the different channel qualities, several short sequences with different alphabet sizes can occur. Large alphabet sizes make the generation of symbol sequences complex, whereas short sequence lengths lead to suboptimal rates.

The presented invention provides a technique in order to generate a sequence of symbols or bits with a desired distribution by combining several pre-sequences over smaller alphabets, for example, binary sequences.

Each pre-sequence has a certain distribution and may be generated from binary data present in the considered system by appropriate distribution matchers. In particular, binary pre-sequences generated by binary distribution matchers can be used.

The generated sequence of symbols can be used for signal shaping in order to achieve a power efficient communication over noisy communication channels, for example, higher order modulation for optical communication systems.

In particular, the present invention is configured to solve both issues (1) and (2) as mentioned above:

Since it uses several distribution matchers DM with smaller output alphabets in order to generate symbol sequences, the complexity of the distribution matchers DM is low on the one hand, and the usage of distribution matchers DM with a smaller alphabet ensures that the rate is close to the optimal value for short sequences on the other hand.

The present invention can be used in order to generate symbol sequences by combining a symbol or binary output of binary distribution matchers DM.

Pre-sequences of different lengths may be combined in order to simultaneously generate symbol or bit sequences over different alphabets. These symbol or bit sequences can be used for signal shaping for parallel communication channels, for example of a DSL communication system.

For the generation of the pre-sequences, any distribution matcher DM may be used, in particular, any of those suggested known in the art.

These and other features and advantages comprised or achieved by the present invention will become apparent from the accompanying drawings and the following detailed description.

In this context, the content of the table of FIG. 9 is to be interpreted in the context of FIG. 10, wherein the table shows the distributions of the binary output sequences of the three binary distribution matchers used for the example in FIG. 10.

The configuration shown in FIG. 5 and further elucidated by the partial structures shown in FIGS. 1 to 4 elucidate a mapping of primary symbol sequences in the sense of bit sequences to secondary symbol sequences.

A number of m binary pre-sequences bn_1 to bn_m each of a respective and not necessarily equal length of n_j bits with j=1, . . . m are generated by the m distribution matchers DM_1 to DM_m as shown in FIG. 2.

In this example, each distribution matcher DM_j uses k_j data bits present in the considered system in order to generate its output symbol or bit sequence bn_j. The numbers k_j of processed data symbols or bits may vary, depending on the distributions imposed on the symbol or bit sequences bn_j.

According to FIG. 10, a Gaussian-like distribution on the underlying symbol alphabet $\{-7, -5, -3, 1, 1, 3, 5, 7\}$ is shown. The abscissa in FIG. 10 represents the real line. The probabilities of the respective symbols are displayed in the vertical direction at the ordinate by respective dots. The distribution is generated by combining—in this example—the output of three binary distribution matchers DM_1 to DM_3. The binary distributions of the three symbol or bit sequences are displayed in the table of FIG. 9.

In the following reference is taken to the distributions shown in FIG. 11 and the tables shown in FIGS. 12 and 13.

Bit mapping achieved by bit mapper BM_1 from the table of FIG. 12 is used, which is displayed as a 3-bit label on the abscissa or horizontal axis. The bit mapping according to bit mapper BM_1 is an instance of the NBBC (natural based binary code) scheme as explained below.

FIG. 11 elucidates the generation of sequences with Gaussian-like distributions over alphabet sizes 8 and 4. The bit mappers BM_1 and BM_2 are listed in the tables of FIGS. 12 and 13, respectively. The bit sequences have the binary distributions from the table of FIG. 9.

The table of FIG. 12 elucidates the bit mapper BM_1 based on an NBBC scheme for an alphabet with eight symbols.

The table of FIG. 13 elucidates the bit mapper BM_2 based on an NBBC scheme for an alphabet with four symbols.

Generating Symbol Distributions

Symbol sequences are generated from sequences over smaller alphabets, e.g. a binary alphabet. FIG. 5—with explanations from FIGS. 1 to 4—depicts the mapping of m parallel bit sequences to one symbol sequence. A number of m binary distribution matchers DM_1 to DM_m transforms uniformly distributed input symbols or bits into a number of m independent bit sequences—in this case—each of length n.

The mapper uses a bit mapper BM in the form of f: $\{0, 1\}^m \to ABM$, with ABM being the alphabet of the bit mapper BM, in order to map the input B_1, B_m to a symbol in the alphabet ABM.

FIG. 11 depicts the extension of FIG. 5 to the case where symbol sequences over different alphabet sizes are generated from the same bit sequences.

Generating Gaussian-Like Distributions by the Natural-Based Binary Code (NBBC)

The described scheme can be used in order to generate from m bit sequences a symbol sequence over an alphabet with $M=2^m$ symbols with a Gaussian-like distribution.

A bit mapper maps m bits to one symbol. It is proposed to use the natural-based binary code (NBBC) scheme in order to generate Gaussian-like distributions. The NBBC scheme may be constructed as follows.

Indexing the symbol alphabet by the natural numbers 0, 1, 2, ..., M−1.

Use the m bit representation $B_1\tilde{B}_2 \ldots \tilde{B}_m$ of the index.

If B1=0, then use $B_2 \ldots B_m = \tilde{B}_2\tilde{B}_3 \ldots \tilde{B}_m$.

If B1=1, then use $B_2B_3 \ldots B_m = \tilde{B}_m\tilde{B}_{m-1} \ldots \tilde{B}_2$, i.e. use the $\tilde{B}_j$ in reverse order.

The tables of FIGS. 12 and 13 display the NBBC schemes for M=8 (m=3) and M=4 (m=2), respectively, as examples.

FIG. 10 demonstrates an example of a Gaussian-like distribution for M=8 (m=3) generated by combining three binary distribution matchers DM_1 to DM_3 with a NBBC bit mapper BM.

Generating Several Symbol Distributions

By using a number of m bit sequences of different output lengths, several shorter symbol sequences over different alphabet sizes can be generated simultaneously. The alphabet size is determined by the number of bit sequences that overlap. If two bit sequences overlap, the symbol alphabet size is $2^2=4$. If a number of m bit sequences overlap, the symbol alphabet size is $2^m$. For each output segment, the bit mapper BM is chosen according to the number of overlapping bit sequences.

An example is displayed in FIG. 11. In this context, bit sequences of lengths of n1, n2, n3 with n1=n2 and n3<n1 are generated. Thus, for the length n3, three bit sequences overlap and a symbol sequence with alphabet size $2^3=8$ can be geneerated.

For the remaining n1-n3 positions, two bit sequences overlap and a symbol sequence with alphabet size $2^2=4$ is generated.

Generating Several Gaussian-Like Distributions

By using NBBC scheme bit mappings that correspond to the number of overlapping bit sequences, each output segment can be generated according to a Gaussian-like distribution over the appropriate alphabet size. FIG. 11 shows an example for the simultaneous generation of a Gaussian-like distribution for symbol alphabet sizes M=8 (m=3) and M=4 (m=2) using the NBBC scheme bit mappers BM_1 and BM_2 displayed in the tables of FIGS. 12 and 13.

System View

The present invention originates from the following aspects:

Consider a transmitter and a receiver that experience a certain connection quality in the sense of a signal-to-noise ratio (SNR). It is usually imposed by environmental conditions, for instance by the distance to a base station, length of copper cables and the like.

Prior to data transmission, transmitter and receiver agree on a transmission setting, for instance they agree on a constellation size and error correcting code to be used in order to ensure that reliable communication is feasible.

Data transmission follows according to these agreed settings. All constellation points are used with equal probabilities.

The last aspect is the most crucial issue, as equal probabilities do not guarantee the most efficient data conversion and/or data transmission from a signal source to a signal sink.

This is the most prominent aspect for the access of the present invention.

System with Distribution Matcher (DM)

General aspects of the present invention are the same as in the above-described setting.

However, according to the present invention an additional degree of freedom is introduced that leads to the advantages of the inventive data conversion and/or data transmission/reception scheme over the conventional one:

According to the present invention, the transmitter side and the receiver side are configured in order to agree on a distribution for the constellation points that is different from the uniform distribution.

Imposing a Gaussian-like or shaped distribution increases the spectral efficiency, i.e., higher data rates can be enabled.

It has to be noted that—except from the steps mentioned below—everything of the processing schemes may be the same when compared to the invention's origins, in particular, the same physical connection and the same waveforms may be used for the transmission.

In other words, the present invention focuses on adjusting the statistics of the modulation points according to the channel conditions and the agreement between the transmitter side and the receiver side.

Based on the observed SNR, the transmitter side and the receiver side are configured to choose a constellation and distribution enabling an improved conversion, transmission and/or reception efficiency.

In the system from which the present invention originates one distribution mapper DM creates n output symbols from k input symbols or bits. In this original case, the output symbols originate from a set with large cardinality, e.g., 8 signal points for an 8-ASK representation of amplitude shift keying.

In the scheme proposed by the present invention, a set of multiple distribution matchers DM_1 to DM_m replaces the single original distribution matcher.

And according to the present invention, now k_j input symbols or bits are transformed by respective distribution matchers DM_j into n or more general respective n_j symbols or bits.

Thus, the set of output symbols is small and for instance binary, but the zeros and ones have a different distribution when compared to those at the input.

The present invention also targets situations with output sets of larger cardinality. However, the binary setting is the easiest example.

The j-th outputs of DM_1 to DM_m are mapped to the j-th output symbol by a symbol mapper BM.

FURTHER EXAMPLE

In the following and by taking reference to FIGS. 14 and 15 a further example is presented in order to further elucidate the present invention and its underlying scheme.

First of all, the transmitter side and the receiver side agree on a certain distribution, for instance a distribution as shown in the table of FIG. 14. In this context, a desired output length of n=30 is agreed upon, too.

Parallelized DM

The desired distribution on the eight constellation points can be decomposed into three binary distributions on the binary set {0, 1} by representing the symbols by three bits, see the corresponding table shown in FIG. 15. For illustrative purpose, the binary label of symbol "−3" is emphasized by the dotted boxes.

The symbol distribution becomes the distribution [½,1/2]×[⅓,2/3]×[⅖,3/5] on {0,1}×{0,1}×{0,1}.

Three binary distribution matchers DM_1 to DM_3 with the given bit distributions can be used instead of one 8-ary distribution matcher.

One possibility to implement that desired mapping are large lookup-tables. The distribution [½,1/2] has the same distribution as the input data, so that the input can simply be copied to the output.

There are $$\binom{30}{10} = 30045015$$

sequences of length 30 that have 10 zeros and 20 ones.

These sequences are used in order to create a distribution of [⅓,2/3]. It can be calculated that about 60 MB are necessary to store such a table.

There are $$\binom{30}{12} = 86493225$$

sequences of length 30 that have 12 zeros and 18 ones.

These sequences can be used in order to create a distribution of [2/*5,3/5]. It can be determined that about 240 MB are necessary to store such a table.

Therefore, memory can be saved and at the same time an increase of efficiency and flexibility by using an algorithmic, on-the-fly encoding instead of the look-up-tables is achieved. In this case, arithmetic coding can be used.

The input lengths of the three distribution matchers DM_1 to DM_3 of this example are:

k_1=30 bits (by just copying the input to the output).

k_2=$\log_2$(30045015)=24 bits (necessary is a selection from 30045015 possible output sequences that have 10 zeros and 20 ones).

k3=$\log_2$(86493225)=26 bits (necessary is a selection from 86493225 possible output sequences that have 12 zeros and 18 ones).

Conventional DM:

This distribution matcher needs to index sequences of length 30 with the 8 symbols {−7, −5, −3, −1, 1, 3, 5, 7} occurring 2, 3, 4, 6, 6, 4, 3, 2 times, respectively. There are $6,1689 \cdot 10^{21}$ sequences of this kind. This corresponds to $1,5728 \cdot 10^7$ TB memory and is not implementable.

Alternatively, on-the-fly encoding by arithmetic coding as suggested can be used also for symbol sequences, which is however of higher complexity than using three parallel binary distribution matchers.

In addition to the foregoing description of the present invention, for an additional disclosure explicit reference is taken to graphic representation of FIGS. 1 to 16.

LIST OF REFERENCES

[1] P. Schulte, G. Böcherer, "Constant Composition Distribution Matching", IEEE Trans. Inf. Theory, vol. 62, no. 1, pages 430-434, January 2016.

[2] T. V. Ramabadran, "A coding scheme for m-out-of-n codes", IEEE Transactions on Communications, vol. 38, no. 8, pages 1156-1163, August 1990.

[3] L. Szczecinski and A. Alvarado, Bit-Interleaved Coded Modulation: Fundamentals, Analysis and Design. John Wiley & Sons, 2015

[4] G. Böcherer, "Capacity-achieving probabilistic shaping for noisy and noiseless channels", Thesis 2012.

LIST OF REFERENCE SIGNS

ABM alphabet of (inverse) symbol/bit mapping process/unit
BM
ADM_j alphabet of (inverse) distribution matching process/unit, j=1, . . . , m
bn_j pre-sequence of symbols/bits with length n (at input side), j=1, . . . , m
bn_j' sequence of symbols/bits with length n (at output side), j=1, . . . , m B input symbol/bit stream
B' (output) symbol/bit stream
B_j partial symbol/bit stream, j=1, . . . , m
B_j' partial symbol/bit stream, j=1, . . . , m
BM symbol/bit mapping process/unit
BM_j symbol/bit mapping sub-process/sub-unit
$BM^{-1}$ inverse/inverted symbol/bit mapping process/unit
DM_j distribution matching process/unit, j=1, . . . , m
$DM\_j^{-1}$ inverse/inverted distribution matching process/unit, j=1, . . . , m
DMX demultiplexing process/unit
MX demultiplexing process/unit
r(t) sent signal, after channel T4 and before demodulator T5
s(t) signal to be sent, after modulator T3 and before channel T4
S output symbol sequence
S' input symbol sequence
T transmission/reception system
T1 information source unit
T2 encoding unit
T3 modulator unit
T4 transmission/reception (waveform) channel unit
T5 demodulator unit
T6 decoder unit
T7 information sink unit
U signal from source T1, before encoder T2
V signal to sink T7, after decoder T6
X signal, after encoder T2 and before modulator T3
Y signal, after demodulator T5 and before decoder T6

The invention claimed is:

1. A method for converting a data signal (U), the method comprising processes of
providing an input symbol stream (B) being representative for the data signal (U) to be converted,
demultiplexing (DMX) the input symbol stream (B) in order to consecutively decompose the input symbol stream (B) into a number m of decomposed partial symbol streams (B_1, . . . , B_m) with m being a natural number,
applying on each of the decomposed partial symbol streams (B_1, . . . B_m) an assigned distribution matching process (DM_1, . . . , DM_m) thereby generating and outputting for each decomposed partial symbol stream (B_1, . . . , B_m) a respective pre-sequence (bn_1, . . . , bn_m) of n_j symbols as an intermediate output symbol sequence, with n_j being a natural number for all j=1 to m, and
supplying the pre-sequences (bn_1, . . . , bn_m) output by the distribution matching processes (DM_1, . . . , DM_m) to at least one symbol mapping process (BM) in order to generate and output a signal representative for a final output symbol sequence (S) as a converted data signal (X),
wherein:
the decomposed partial symbol streams (B_1, . . . , B_m) are supplied to a respective number of m distribution matching processes (DM_1, . . . , DM_m);
each of the distribution matching processes (DM_1, . . . , DM_m) and the symbol mapping process (BM) are based on a respective assigned alphabet (ADM_1, . . . , ADM_m; ABM) of symbols; and
the cardinality of each of the alphabets (ADM_1, . . . , ADM_m) of symbols of the distribution matching processes (DM_1, . . . , DM_m) is lower than the cardinality of the alphabet (ABM) of symbols of the symbol mapping process (BM).

2. The method according to claim 1,
wherein at least one of
each respective one of the distribution matching processes (DM_j, j=1, . . . , m) and
the symbol mapping process (BM)
configured to be invertible.

3. The method according to claim 2,
wherein at least one of
each of the distribution matching processes (DM_j, j=1, . . . , m) and
the symbol mapping process (BM)
is configured to achieve an approach of the empirical distribution of the final output symbol sequence (S) to the respective underlying distribution by accordingly indexing respective output sequences out of a respective entire set of candidates.

4. The method according to claim 1, wherein each respective one of the distribution matching processes (DM_j, j=1, . . . , m) is configured to use a respective number k_j of consecutive symbols provided by the demultiplexing (DMX), with k_j for each j=1, . . . , m being a natural number.

5. The method according to claim 4, wherein each of the distribution matching processes (DM_j, j=1, . . . , m) is configured to arrange the consecutive symbols provided by the demultiplexing DMX) within each respective one of the pre-sequences (bn_1, . . . , bn_m) of n_j symbols, such that for the final output symbol sequence (S) the empirical distribution coincides with or approaches the respective underlying distribution.

6. The method according to claim 1,
wherein the process of providing the input symbol stream (B) comprises at least one of
recalling the input symbol stream (B) from a storage medium or from a symbol generation process, and
receiving, demodulating and/or decoding a signal being representative for or conveying the input symbol stream (B).

7. The method according to claim 1, wherein at least one of
the symbol mapping process (BM) has m input channels and/or wherein m input channels are distributed over a plurality of symbol mapping sub-processes (BM_1, . . . BM_1); and
wherein the symbol mapping process (BM) is based on a modulation process and in particular on a digital or analog quadrature amplitude modulation process.

8. The method according to claim 1,
wherein at least one of
each respective one of the distribution matching processes (DM_j, j=1, . . . , m) and
the symbol mapping process (BM)
is configured to be at least one of based on and chosen according to a predefined distribution, and optionally on a Gaussian distribution.

9. The method according to claim 1, wherein each of the distribution matching processes (DM_j, j=1, . . . , m) is configured such that for each pair of distribution matching processes (DM_j1, DM_j2) the relation $$n\_j1 = n\_j2 \qquad (1)$$

is fulfilled, for each j1, j2=1, m being natural numbers and n_j1, n_j2 as natural numbers describing a number of consecutive symbols provided with the respective pre-sequence (bn_j1, bn_j2) and by the respective underlying distribution matching processes (DM_j1, DM_j2).

10. The method according to claim 1, wherein the input symbol stream (B), at least one of the partial symbol streams (B_1, ..., B_m), at least one of the respective pre-sequences (bn_1, ..., bn_m) of intermediate output symbol sequences and/or the final output symbol sequence (S) are at least partially formed by binary bits.

11. A data transmission system (T), comprising a processing unit with a data transmission section configured to perform the method according to claim 1, the data transmission system comprising:
(i) a unit for providing an input symbol stream (B) being representative for the data signal (U) to be converted,
(ii) a unit (DMX) for demultiplexing the input symbol stream (B) in order to consecutively decompose the input symbol stream (B) into a number m of decomposed partial symbol streams (B_1, ..., B_m) with m being a natural number,
(iii) a unit for applying on each of the decomposed partial symbol streams (B_1, ..., B_m) an assigned distribution matching process (DM_1, ..., DM_m) thereby generating and outputting for each decomposed partial symbol stream (B_1, ..., B_m) a respective pre-sequence (bn_1, ..., bn_m) of n_j symbols as an intermediate output symbol sequence, with n_j being a natural number for all j=1 to m, and
(iv) a unit for supplying the pre-sequences (bn_1, ..., bn_m) output by the distribution matching processes (DM_1, ..., DM_m) to at least one symbol mapping process (BM) in order to generate and output a signal representative for a final output symbol sequence (S) as a converted data signal (X),
wherein:
(v) each of the distribution matching processes (DM_1, ..., DM_m) and the symbol mapping process (BM) are based on a respective assigned alphabet (ADM_1, ..., ADM_m; ABM) of symbols;
(vi) the decomposed partial symbol streams (B_1, ..., B_m) are supplied to a respective number of m distribution matching processes (DM_1, ..., DM_m); and
(vii) the cardinality of each of the alphabets (ADM_1, ..., ADM_m) of symbols of the distribution matching processes (DM_1, ..., DM_m) is lower than the cardinality of the alphabet (ABM) of symbols of the symbol mapping process (BM).

12. The data transmission system according to claim 11, wherein involved distribution matching processes (DM_j, j=1, ..., m) and inverse distribution matching processes (DM_j$^{-1}$, j=1, ..., m) at least one of:
are inverse to each other, and
have respectively coinciding alphabets (ADM_j, j=1, ..., m) of symbols.

13. The data transmission system according to claim 11, wherein involved symbol mapping processes (BM) and inverse symbol mapping processes (BM$^{-1}$) at least one of:
are inverse to each other, and
have respectively coinciding alphabets (ABM_j, j=1, ..., m) of symbols.

14. A method for reconverting a converted data signal (Y), the method comprising processes of
providing an input symbol stream (S') being representative for the converted data signal (Y) to be reconverted,
supplying said input symbol stream (S') to at least one inverse symbol mapping process (BM$^{-1}$) with m output channels and m being a natural number in order to generate and output a number of m intermediate output symbol sequences (bn_1', ..., bn_m') of n_j symbols with n_j being a natural number for all j=1 to m,
applying to each of the intermediate output symbol sequences (bn_1', ..., bn_m') an assigned inverse distribution matching process (DM_1$^{-1}$, ..., DM_m$^{-1}$) thereby generating and outputting for each of the intermediate output symbol sequences (bn_1', ..., bn_m') a respective partial symbol stream (B_1', ..., B_m') of k_j symbols, with k_j being a natural number for all j=1 to m, and
multiplexing (MX) the partial symbol streams (B_1', ..., B_m') in order to consecutively compose and output a final output symbol stream (B') being the or being representative for a reconverted data signal (V),
wherein:
the intermediate output symbol sequences (bn_1', ..., bn_m') are supplied to a respective number of m inverse distribution matching processes (DM_1$^{-1}$, ..., DM_m$^{-1}$)
each of the inverse distribution matching processes (DM_1$^{-1}$, ..., DM_m$^{-1}$) and the inverse symbol mapping process (BM$^{-1}$) are based on a respective assigned alphabet (ADM_1, ..., ADM_m; ABM) of symbols, and
the cardinality of each of the alphabets (ADM_1, ..., ADM_m) of symbols of the inverse distribution matching processes (DM_1$^{-1}$, ..., DM_m$^{-1}$) is lower than the cardinality of the alphabet (ABM) of symbols of the inverse symbol mapping process (BM$^{-1}$).

15. The method according to claim 14,
wherein at least one of
each respective one of the inverse distribution matching processes (DM_j$^{-1}$, j=1, ..., m) and
the inverse symbol mapping process (BM$^{-1}$)
is configured to be invertible.

16. The method according to claim 15, wherein each of the inverse distribution matching processes (DM_j$^{-1}$, j=1, ..., m) is configured such that a respective underlying distribution matching process (DM_j, j=1, ..., m) is capable of arranging consecutive symbols provided by a demultiplexing process (DMX) within a respective one of the pre-sequences (bn_1, ..., bn_m) of n_j symbols, such that for a final output symbol sequence (S) the empirical distribution coincides with or approaches the respective underlying distribution.

17. The method according to claim 15,
wherein at least one of:
each of the inverse distribution matching processes (DM_j$^{-1}$, j=1, ..., m) and
the inverse symbol mapping process (BM$^{-1}$)
is configured such that a respective underlying distribution matching processes (DM_j, j=1, ..., m) and/or a symbol mapping process (BM) is capable of approaching the empirical distribution of a final output symbol sequence (S) to the respective underlying distribution by accordingly indexing respective output sequences out of a respective entire set of candidates.

18. The method according to claim 14, wherein each respective one of the inverse distribution matching processes (DM_j$^{-1}$, j=1, ..., m) is configured to output a respective number k_j of consecutive symbols to be provided to the multiplexing process (MX), with k_j for each j=_1, ..., m being a natural number.

19. The method according claim 14,
wherein the process of providing the input symbol stream (B') comprises at least one of
recalling the input symbol stream (B') from a storage medium or from a symbol generation process, and
receiving, demodulating and/or decoding a signal being representative for or conveying the input symbol stream (B').

20. The method according to claim 14,
wherein at least one of
each respective one of the inverse distribution matching processes (DM_j$^{-1}$, j=1, ..., m) and
the inverse symbol mapping process (BM$^{-1}$)
is configured to be at least one of based on and chosen according to a predefined distribution, and optionally on a Gaussian distribution.

21. The method according to claim 14, wherein each of the inverse distribution matching processes (DM_j$^{-1}$, j=1, ..., m) is configured such that for each pair of inverse distribution matching processes DM_j1$^{-1}$, DM_j2$^{-1}$) the relation $$n\_j1 = n\_j2 \qquad (1)$$

is fulfilled, for each j1, j2=1, ..., m being natural numbers and n_j1, n_j2 describing a number of consecutive symbols to be provided with the respective intermediated output symbol sequences (bn_j1', bn_j2') to the respective underlying inverse distribution matching processes (DM_j1$^{-1}$, DM_j2$^{-1}$).

22. A data reception system (T) comprising a processing unit with a data reception system configured to perform the method according to claim 7, the data reception system comprising:
(i) a unit for providing an input symbol stream (S') being representative for the converted data signal (Y) to be reconverted,
(ii) a unit for supplying said input symbol stream (S') to at least one inverse symbol mapping process (BM$^{-1}$) with m output channels and m being a natural number in order to generate and output a number of m intermediate output symbol sequences (bn_1', ..., bn_m') of n_j symbols with n_j being a natural number for all j=1 to m,
(iii) a unit for applying to each of the intermediate output symbol sequences (bn_1', ..., bn_m') an assigned inverse distribution matching process (DM_1$^{-1}$, ..., DM_m$^{-1}$) thereby generating and outputting for each of the intermediate output symbol sequences (bn_1', ..., bn_m') a respective partial symbol stream (B_1', ..., B_m') of k_j symbols, with k_j being a natural number for all j=1 to m, and
(iv) a unit (MX) for multiplexing the partial symbol streams (B_1', ..., B_m') in order to consecutively compose and output a final output symbol stream (B') being the or being representative for a reconverted data signal (V),
wherein:
(v) each of the inverse distribution matching processes (DM_1$^{-1}$, ..., DM_m$^{-1}$) and the inverse symbol mapping process (BM$^{-1}$) are based on a respective assigned alphabet (ADM_1, ..., ADM_m; ABM) of symbols,
(vi) the intermediate output symbol sequences (bn_1', ..., bn_m') are supplied to a respective number of m inverse distribution matching processes (DM_1$^{-1}$, ..., DM_m$^{-1}$); and
(vii) the cardinality of each of the alphabets (ADM_1, ..., ADM_m) of symbols of the inverse distribution matching processes (DM_1$^{-1}$, ..., DM_m$^{-1}$) is lower than the cardinality of the alphabet (ABM) of symbols of the inverse symbol mapping process (BM$^{-1}$).

23. The data reception system of claim 22, wherein involved distribution matching processes (DM_j, j=1, ..., m) and inverse distribution matching processes (DM_j$^{-1}$, j=1, ..., m) at least one of:
are inverse to each other, and
have respectively coinciding alphabets (ADM_j, j=1, ..., m) of symbols.

24. The data reception system of claim 22, wherein involved symbol mapping processes (BM) and inverse symbol mapping processes (BM$^{-1}$) at least one of:
are inverse to each other, and
have respectively coinciding alphabets (ABM_j, j=1, ..., m) of symbols.

* * * * *